US008079006B2

(12) United States Patent
Yamasaki

(10) Patent No.: US 8,079,006 B2
(45) Date of Patent: Dec. 13, 2011

(54) SIMULATION METHOD AND COMPUTER-READABLE STORAGE MEDIUM STORING PROGRAM FOR CAUSING COMPUTER TO ANALYZE CIRCUIT OPERATION USING CELL CHARACTERISTICS AFFECTED BY ENVIRONMENT

(75) Inventor: Osamu Yamasaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 558 days.

(21) Appl. No.: 12/126,063

(22) Filed: May 23, 2008

(65) Prior Publication Data
US 2009/0037856 A1 Feb. 5, 2009

(30) Foreign Application Priority Data

Aug. 2, 2007 (JP) .................................. 2007-202076

(51) Int. Cl.
*G06F 17/50* (2006.01)
(52) U.S. Cl. ........ 716/115; 716/108; 716/109; 716/113; 716/133; 716/134; 703/19
(58) Field of Classification Search .................. 716/4–6, 716/108, 109, 113, 115, 132, 133, 134, 135; 703/19
See application file for complete search history.

(56) References Cited

U.S. PATENT DOCUMENTS

| 2001/0018758 A1* | 8/2001 | Tanaka et al. ..................... 716/6 |
| 2002/0077798 A1 | 6/2002 | Inoue et al. |
| 2007/0106966 A1* | 5/2007 | Inoue et al. ........................ 716/4 |
| 2007/0204250 A1* | 8/2007 | Moroz et al. .................... 716/10 |
| 2009/0013292 A1* | 1/2009 | Brunet .............................. 716/6 |

FOREIGN PATENT DOCUMENTS

JP 11-284170 A 10/1999

* cited by examiner

*Primary Examiner* — Paul Dinh
*Assistant Examiner* — Nha Nguyen
(74) *Attorney, Agent, or Firm* — Westerman, Hattori, Daniels & Adrian, LLP

(57) ABSTRACT

A simulation method, to be implemented in a computer, carries out a simulation of a semiconductor integrated circuit. The simulation method carries out a layout analysis based on layout data of a circuit formed by cells and stores values of layout parameters obtained by the layout analysis. Basic cell characteristics of the cells are read from a net list representing the extracted basic cell characteristics by the layout parameters and the basic cell characteristics represented by the layout parameters are stored. The stored values of the layout parameters are read and substituted into the basic cell characteristics represented by the layout parameters to obtain cell characteristics, and the cell characteristics are stored. An operation of the circuit is analyzed using the cell characteristics that are obtained.

20 Claims, 14 Drawing Sheets

SIMULATION METHOD AND COMPUTER-READABLE STORAGE MEDIUM STORING PROGRAM FOR CAUSING COMPUTER TO ANALYZE CIRCUIT OPERATION USING CELL CHARACTERISTICS AFFECTED BY ENVIRONMENT

BACKGROUND OF THE INVENTION

The present invention generally relates to simulation methods and computer-readable storage media, and more particularly to a simulation method for carrying out a layout analysis and the like of a semiconductor integrated circuit, and to a computer-readable storage medium which stores a program for causing a computer to carry out procedures of such a simulation method.

Recently, the integration density of semiconductor integrated circuits, namely, Large Scale Integrated circuits (LSI), has increased considerably. As a result, the performance of the circuits is greatly affected by layout patterns and layout positions of cells and circuits formed by such cells, and inconsistencies introduced during production of the circuits. In addition, it is becoming more difficult in circuit simulation to sufficiently represent circuit characteristics, such as characteristics of the cells. For example, even when the cells or the circuits have the same shape, the circuit characteristics may differ depending on the layout positions and the layout shapes. The circuit characteristics of the cells or circuits having the same shape become different depending on the layout positions and the layout shapes of the circuit mainly due to deviation of the circuit characteristics depending on the pitch of polysilicon gates of transistors and deviation of the circuit characteristics depending on stress caused by Shallow Trench Isolation (STI). Such deviations of the circuit characteristics are becoming more conspicuous with the increasing integration density of the LSIs. In addition, the effects of the layout patterns and the layout positions of the cells and the circuits and the inconsistencies introduced during production of the circuits on the circuit characteristics are becoming more and more complex.

Moreover, before and after assembly of the LSIs, the package stress becomes different depending on the positions of the cells and the circuits. Accordingly, it may be expected that the circuit characteristics will similarly differ before and after assembly of the LSIs.

Furthermore, the effects of not only the characteristics of the elements such as the transistors, but also wirings or interconnections connecting the elements and the circuits are becoming more conspicuous. Consequently, even in the case of identical circuits or identical cells, the circuit characteristics will differ depending on the wirings in the periphery of the identical circuits or identical cells.

There are demands to take the above described phenomena into consideration when carrying out a simulation, in order to improve the accuracy with which the circuit characteristics are predicted (hereinafter referred to as the prediction accuracy of the circuit characteristics).

A technique which analyzes a peripheral state of an target element or circuit, and feeds back an analysis result to a simulation environment is known.

FIG. 1 is a flow chart for explaining an example of a related simulation method. In FIG. 1, a step S1 carries out a layout analysis based on layout data, which indicate layout patterns and layout positions of elements and circuits. A step S2 makes a modification based on a result of the layout analysis, with respect to a net list of characteristics of cells that is, cell characteristics forming the circuit, which is being extracted or is already extracted. A step S3 reextracts the cell characteristics from the modified net list. A step S4 analyzes the reextracted net list. The steps S1 through S3 are repeated every time a modification is applied to the layout.

Normally, analysis in the semiconductor chip level, such as a timing analysis, is carried out using the cell characteristics, and no simulation is carried out with respect to the characteristic of the cell itself.

According to the techniques described above, a modification is made based on the result of the layout analysis, with respect to the net list or circuit information of cell characteristics forming the circuit, which is being extracted or is already extracted. For this reason, it is necessary to reextract the cell characteristics from the modified net list. In addition, even for identical cells, it is necessary to extract the cell characteristics for every layout state.

Therefore, because the net list is modified when modifying the layout, it is necessary to extract the cell characteristics from the net list every time the layout modification is made or, for every layout. As a result, it is difficult to efficiently carry out the simulation and to improve the prediction accuracy of the circuit characteristics.

SUMMARY OF THE INVENTION

According to one aspect of the present invention, there is provided a simulation method, to be implemented in a computer, for carrying out a simulation of a semiconductor integrated circuit, the simulation method comprising a first analyzing procedure carrying out a layout analysis based on layout data of a circuit formed by cells, and storing values of layout parameters obtained by the layout analysis into a storage part; an extracting procedure extracting basic cell characteristics of the cells from a net list, representing the extracted basic cell characteristics by the layout parameters, and storing the basic cell characteristics represented by the layout parameters into the storage part, the basic cell characteristics including at least one of a delay time, a noise characteristic, a leak current and a power consumption; an acquiring procedure reading the values of the layout parameters from the storage part, substituting the read values into the basic cell characteristics represented by the layout parameters to obtain cell characteristics, and storing the cell characteristics in the storage part; and a second analyzing procedure analyzing an operation of the circuit using the cell characteristics obtained by the acquiring procedure. According to the simulation method, it is possible to carry out a simulation efficiently and to improve the prediction accuracy of circuit characteristics.

DESCRIPTION OF THE PREFERRED EMBODIMENTS

In one embodiment of the present invention, an analysis is carried out by taking into consideration the effects of a peripheral environment or state, such as peripheral cells of a target cell and wirings or interconnections, on a target cell, for each layout. A deviation in circuit characteristics caused by the layout is input to a simulation, in order to improve the prediction accuracy of the circuit characteristics. The cell is a unit with which the circuit is formed.

More particularly, the layout analysis is carried out based on layout data, which indicate layout patterns and layout positions of the elements and the circuits formed by the cells, to thereby obtain first layout information or layout parameters. In addition, basic cell characteristics including at least one of a delay time, a noise characteristic, a leak current, a power consumption and the like, is represented by second layout information or layout parameters which is different from the first layout information. The cell characteristics dependent upon the layout are represented by substituting each first layout parameter acquired by the layout analysis into the basic cell characteristics. The layout used for extraction of the basic cell characteristics, which is represented by the second layout information, is not a layout that is actually analyzed by the layout analysis, but is a layout for forming the basic cell characteristics into a function or a table by varying, in advance, values of the parameters within a range that is tolerable with respect to the layout to which the layout analysis is actually carried out.

Because it is unnecessary to modify a net list when modifying the layout, it is unnecessary to extract the cell characteristics from the net list every time the layout is modified or, for every layout. Accordingly, it is possible to input the deviation in the circuit characteristics caused by the layout to the simulation and improve the prediction accuracy of the circuit characteristics, and at the same time, efficiently carry out the analysis in the chip level.

A description will now be given of embodiments of the simulation method and the computer-readable storage medium according to the present invention, by referring to FIG. 2 and the subsequent figures.

Figure 1:
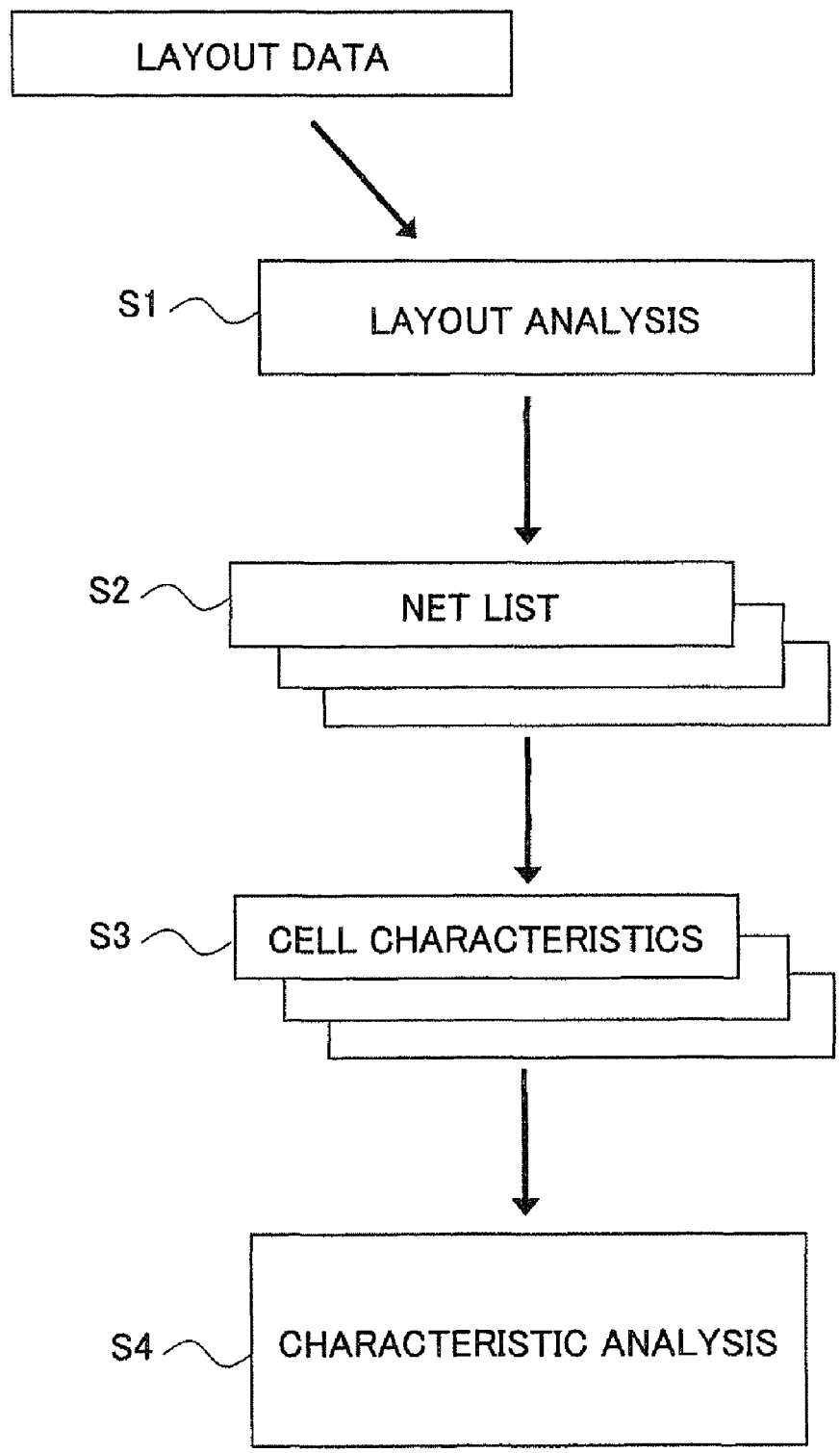
FIG. 1 is a flow chart for explaining an example of a related simulation method.
Figure 2:
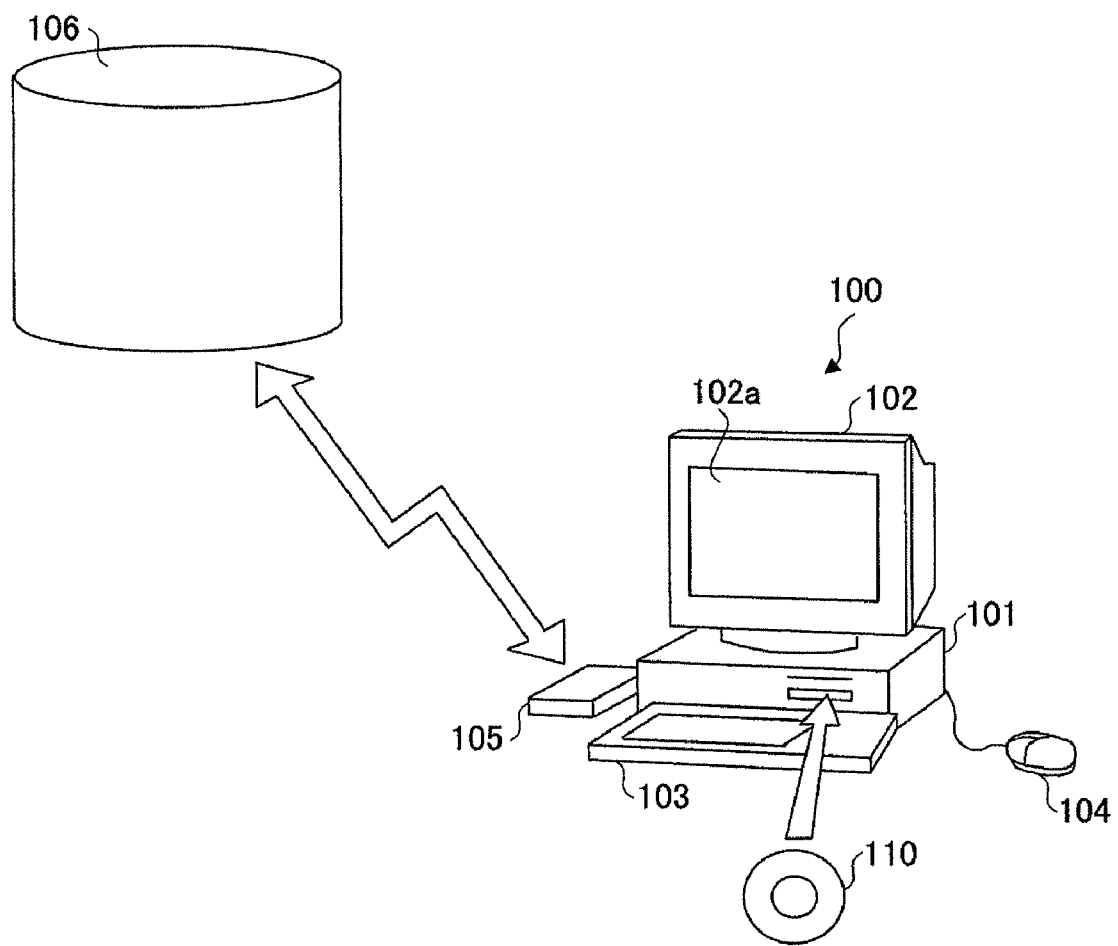
FIG. 2 is a perspective view showing a computer system to which an embodiment of the present invention may be applied.

FIG. 2 is a perspective view showing a computer system to which an embodiment the present invention may be applied. A computer system 100 shown in FIG. 2 includes a main body 101, a display 102, a keyboard 103, a mouse 104, and a modem 105. The main body 101 includes a CPU, a disk drive and the like. The display 102 displays the results of the circuit analysis and the like on a display screen 102a in response to an instruction from the main body 101. The keyboard 103 is used to input various information to the computer system 100. The mouse 104 is used to specify an arbitrary position on the display screen 102a of the display 102. The modem 105 is used to make access to an external database and the like, and to down load programs and the like stored in other computer systems.

A program or simulation software or tool, which causes the computer system 100 to at least have a simulation function including layout analysis and circuit characteristic or cell characteristic analysis, is input to and compiled in the computer system 100. This program is stored in a portable recording medium such as a disk 110 or, is downloaded from a recording medium 106 of another computer system using a communication apparatus such as the modem 105. This program causes the computer system 100 that is, a processor 201 which will be described later to operate as a circuit design support apparatus or simulation system having the simulation function. This program may be stored in a computer-readable storage medium such as the disk 110. The computer-readable storage medium is not limited to portable recording media such as the disk 110, an Integrated Circuit (IC) card memory, a magnetic disk such as a floppy disk (registered trademark), a magneto-optical disk, a CD-ROM and the like, and includes various recording media capable of accessing a computer system that is connected to the computer system 100 via a communication means or communication apparatus such as the modem 105 and a Local Area Network (LAN).

Figure 3:
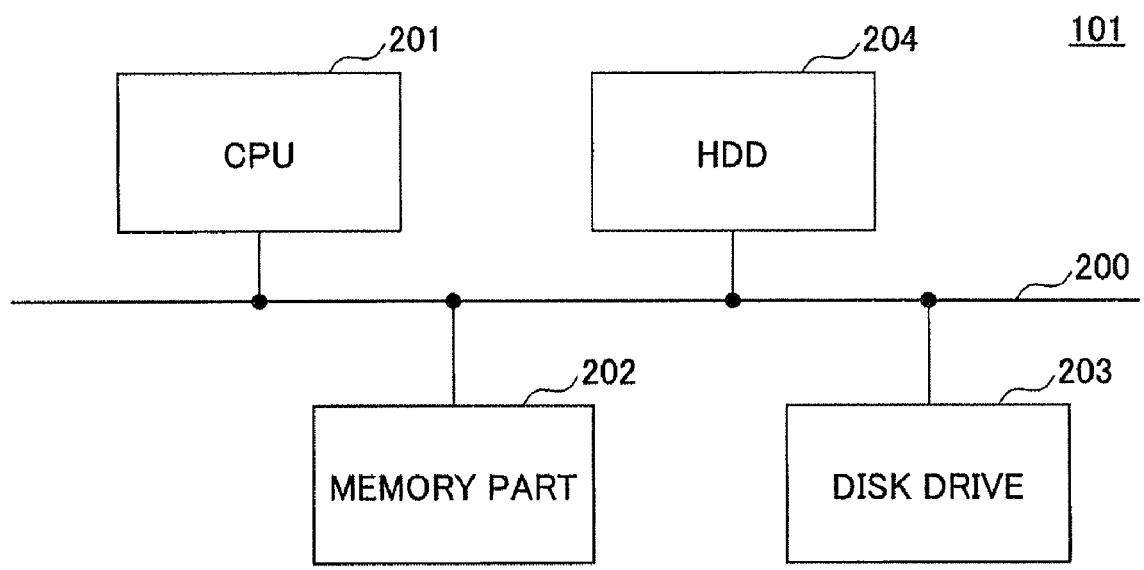
FIG. 3 is a system block diagram showing a structure of a part within a main body of the computer system.

FIG. 3 is a system block diagram showing a structure of a part within the main body 101 of the computer system 100. In FIG. 3, the main body 101 includes a processor, for example a Central Processing Unit (CPU) 201, a memory part 202 including a Random Access Memory (RAM), a Read Only Memory (ROM) and the like, a disk drive 203 for the disk 110, and a Hard Disk Drive (HDD) 204 which are connected via a bus 200. In this embodiment, the display 102, the keyboard 103 and the mouse 104 are also connected to the CPU 201 via the bus 200. However, the display 102, the keyboard 103 and the mouse 104 may be connected directly to the CPU 201. In addition, the display 102 may be connected to the CPU 201 via a known graphic interface (not shown) which processes input and output image data.

In the computer system 100, the keyboard 103 and/or the mouse 104 forms an input part or input means of the circuit design support apparatus. The display 102 forms a display part or display means for displaying simulation results, such as analysis results, on the display screen 102a. The CPU 201 forms a first analyzing part or first analyzing means for carrying out a layout analysis based on layout data of an analyzing target and outputting first layout information or layout parameters by executing a first analyzing procedure, an extracting part or extracting means for extracting basic cell characteristics based on second layout information or layout parameters which is different from the first layout information by executing an extracting procedure, an acquiring part or acquiring means for acquiring cell characteristics for each layout by substituting the first layout information into the basic cell characteristics by executing an acquiring procedure, and a second analyzing part or second analyzing means for analyzing the acquired cell characteristics by executing a second analyzing procedure. The memory part 202 and/or the disk drive 102 and/or the HDD 204 form a storage part or storage means.

The structure of the computer system 100 is not limited to that shown in FIGS. 2 and 3, and various other known structures may be used instead.

Figure 4:
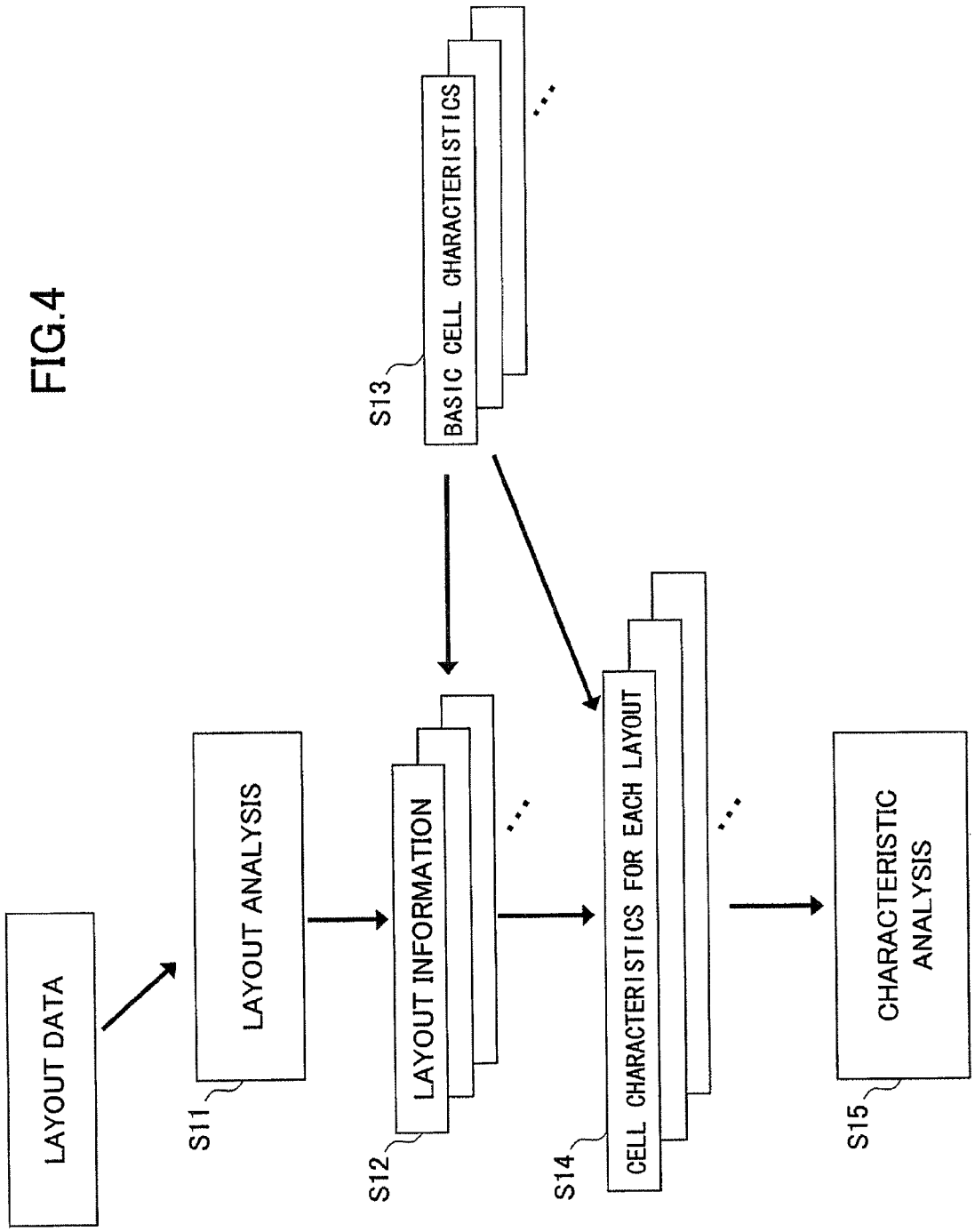
FIG. 4 is a flow chart for explaining a general operation of the computer system in an embodiment of the present invention.

FIG. 4 is a flow chart for explaining a general operation of the computer system 100 in an embodiment of the present invention. The process shown in FIG. 4 is executed by the CPU 201. In FIG. 4, a step S11 carries out a layout analysis based on layout data read from the storage part or input from the input part. The layout data indicate layout patterns and layout positions of the circuits and the cells which are the analyzing target. A step S12 stores the first layout information (layout parameters) that is obtained as a result of the layout analysis into the storage part. As will be described later, the layout analysis may regard up to the inside of the target cell as the analyzing target or, regard the target cell as a so-called black box and exclude the inside of the target cell from the analyzing target. A step S13 extracts or characterizes characteristics of cells hereinafter referred to as cell characteristics including at least one of a delay time, a noise characteristic, a leak current, a power consumption and the like from a net list, and stores basic cell characteristics represented by the second layout information (layout parameters) into the storage part. Each of the net list and the second layout information may be read from the storage part or, input from the input part. The layout which is represented by the second layout information and is used to extract the basic cell characteristics, is not the layout which is used to actually carry out the layout analysis when obtaining the first layout information, but is the layout which is used to form the basic cell characteristics into the function or the table by varying, in advance, the values of the parameters within the range that is tolerable that is, by varying the parameters within the range tolerable by the analysis with respect to the layout to which the layout analysis is actually carried out. The layout which is used to extract the basic cell characteristics desirably has characteristic values and simulation values that are calibrated, such as a Test Element Group (TEG), for example. A step S14 reads the first layout information which is output in the step S12 from the storage part, and substitutes the first layout information into the basic cell characteristics which are extracted in the step S13 and read from the storage part, to obtain the cell characteristics for each layout and to store the cell characteristics into the storage part. A step S15 reads the extracted cell characteristics from the storage part and analyzes the cell characteristics in order to analyze the operation of the circuit, and to store results of the analysis into the storage part if necessary and to display the analysis results on the display part.

Figure 5:
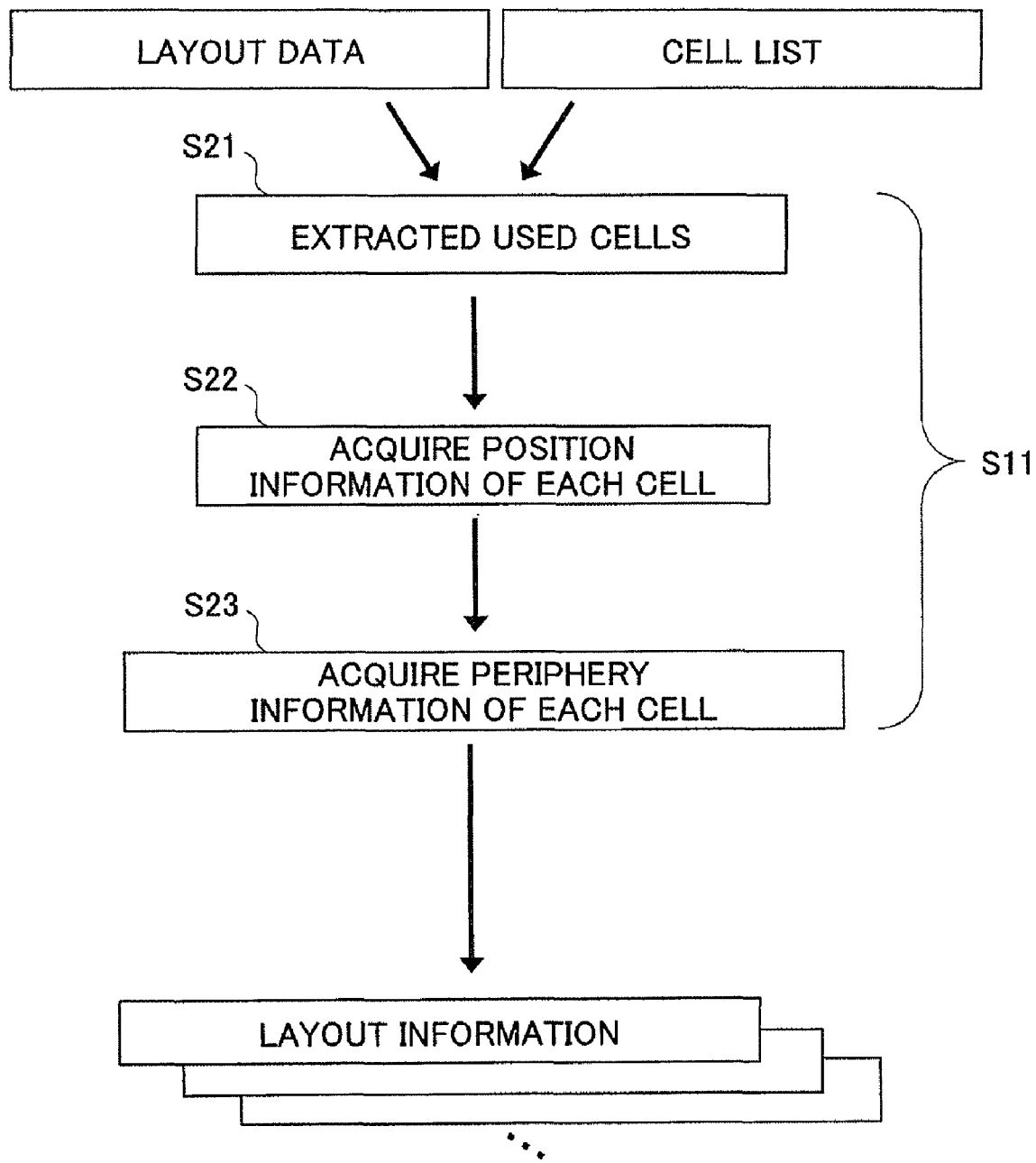
FIG. 5 is a flow chart for explaining, in more detail, a layout analysis having up to an inside of a target cell as an analyzing target.

FIG. 5 is a flow chart for explaining, in more detail, the layout analysis of the step S12 having up to the inside of the target cell as the analyzing target. In FIG. 5, a step S21 extracts the cells which are used in the layout data of the analyzing target from a cell list which is prepared in advance. The layout patterns and the layout positions may differ even for the identical cells, and for this reason, each individual cell is extracted separately. Each of the layout data and the cell list may be read from the storage part or, input from the input part. In addition, the cell list includes at least the cell with respect to which the basic cell characteristics are to be obtained as will be described later.

Figure 6:
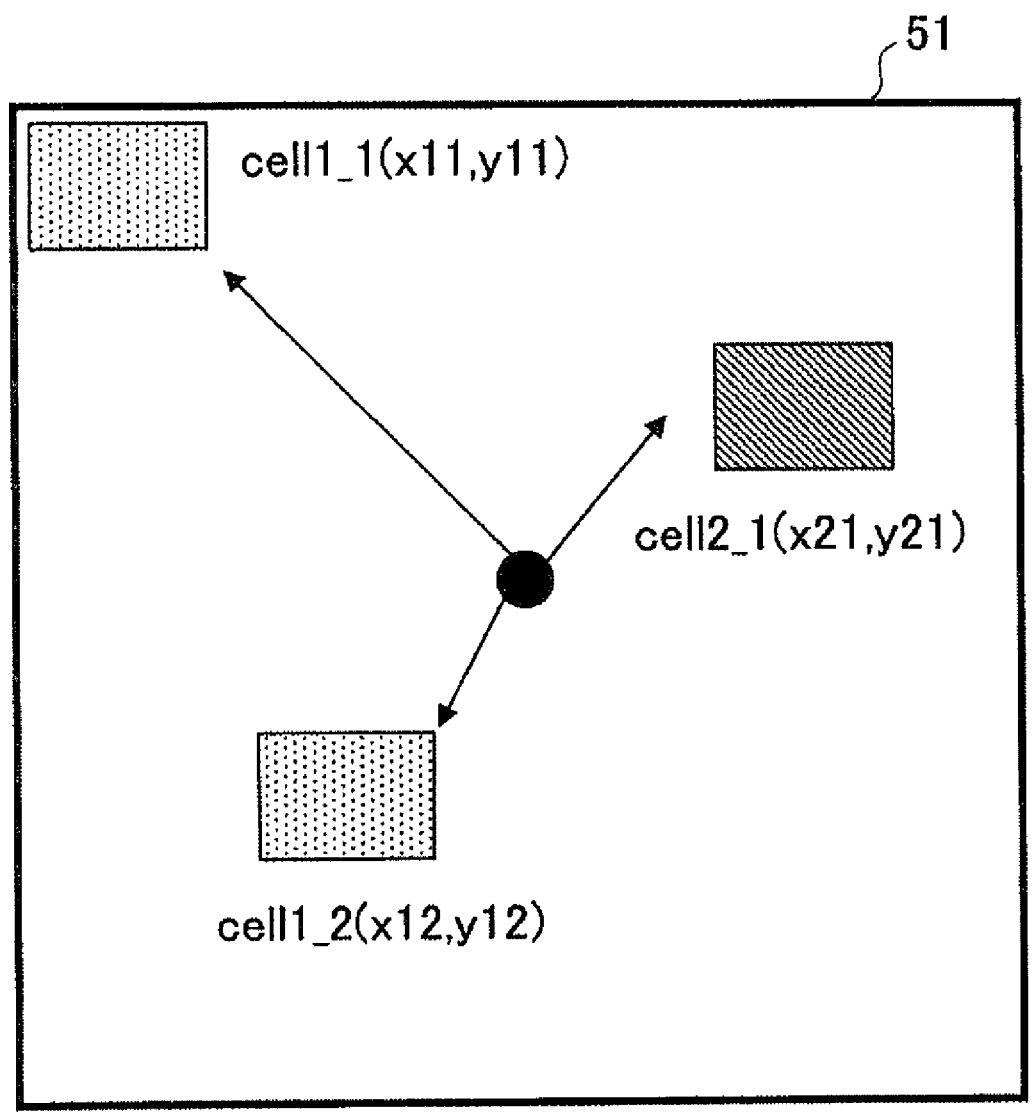
FIG. 6 is a diagram for explaining acquisition of cell position information.

A step S22 acquires cell position information, that is, cell coordinates (x, y) shown in FIG. 6, of each cell that is extracted in the step S21. FIG. 6 is a diagram for explaining acquisition of the cell position information. FIG. 6 shows, as an example, cell coordinates cell1_1(x11, y11), cell1_2(x12, y12) and cell2_1(x21, y21) of three cells cell1_1, cell1_2 and cell2_1. In FIG. 6, a chip region is designated by a reference numeral 51. Even in the case of identical cells on the chip, the cell characteristics may differ depending on the positions of the cells. The differences in the cell characteristics of the identical cells are caused by the deviation of the cell characteristics depending on the pitch of polysilicon gates of the transistors, which are one example of the elements forming the cell, and the deviation of the cell characteristics depending on the stress caused by the Shallow Trench Isolation (STI). The differences in the cell characteristics of the identical cells become conspicuous in a case where the cells are assembled into a package, for example. In such a case, the stress applied on the cell from the package differs depending on the position of the cell, and the cell characteristics of the identical cells become different depending on the positions of the cells.

Figure 7:
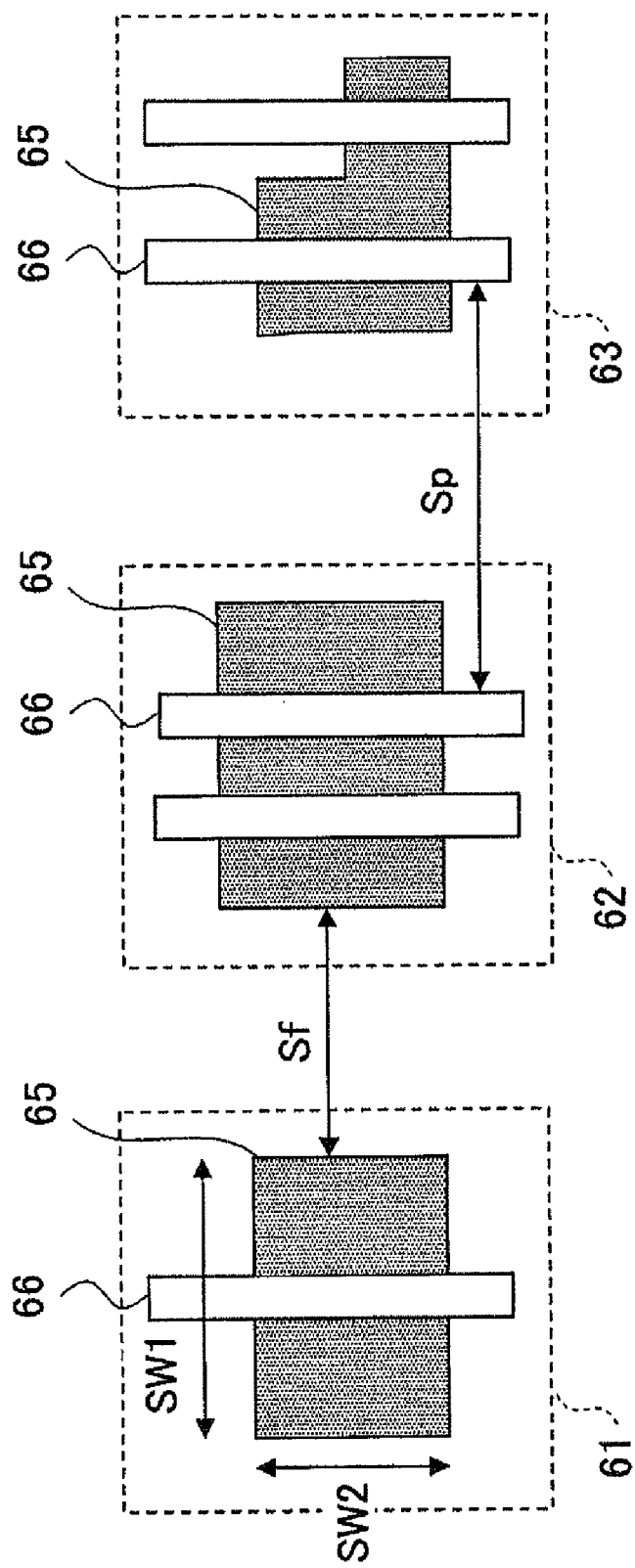
FIG. 7 is a diagram for explaining acquisition of cell periphery information.

A step S23 acquires cell periphery information related to a bulk, a wiring and the like of each cell extracted in the step S21. FIG. 7 is a diagram for explaining the acquisition of the cell periphery information. In FIG. 7, extracted cells are designated by reference numerals, 61, 62 and 63, and it is assumed for the sake of convenience that the cell 62 is the target cell. In addition, a diffusion region is designated by a reference numeral 65, and a polysilicon gate of a transistor forming each cell is designated by a reference numeral 66. The cell periphery information related to the bulk of the target cell 62 includes a distance or separation Sf between the diffusion region 65 of the target cell 62 and the diffusion region 65 of each of the peripheral cells 61 and 63, a distance or separation Sp between the polysilicon gate 66 of the target cell 62 and the polysilicon gate 66 of each of the peripheral cells 61 and 63, and the like. FIG. 7 only shows the peripheral cells 63 and 61 on the right and left sides of the target cell 62. However, in a case where peripheral cells exist on the top and bottom sides of the target cell 62, the cell periphery information related to the bulk of the target cell 62 includes a distance or separation Sf between the diffusion region 65 of the target cell 62 and the diffusion region 65 of each of the peripheral cells on the top and bottom sides, a width SW1 of the diffusion region 65 in a horizontal direction, a length SW2 of the diffusion region 65 in a vertical direction, a distance or separation Sp between the polysilicon gate 66 of the target cell 62 and the polysilicon gate 66 of each of the peripheral cells on the top and bottom sides, an extending direction of the polysilicon gate 66, and the like. Of course, the extending direction of the polysilicon gate 66 is not limited to one direction as in the case shown in FIG. 7.

The target cell 62 shown in FIG. 7 is prepared in the cell list, but it is not essential for the peripheral cells 61 and 63 to be prepared in the cell list. This is because, when the analysis is carried out by regarding up to the inside of the target cell 62 as the analyzing target, it is possible to acquire and feed back the cell periphery information to the characteristics of the target cell 62 as long as the information of the diffusion regions 65, the polysilicon gates 66 and the like exist, even if the peripheral cells 61 and 63 are not in the cell list.

Figure 8:
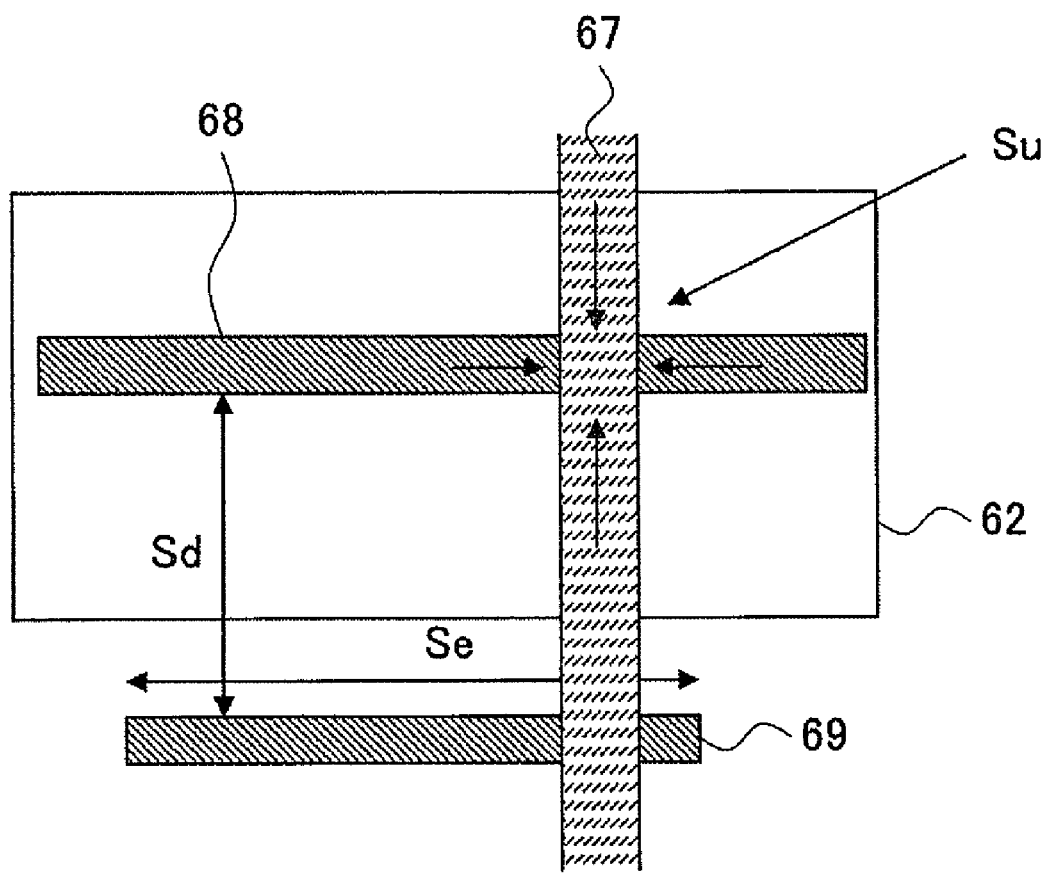
FIG. 8 is a diagram for explaining wirings running over a cell.

FIG. 8 is a diagram for explaining wirings running over the target cell 62. FIG. 8 shows a wiring 67 running over the target cell 62, a wiring 68 running inside the target cell 62, and a wiring 69 running on a side (that is, running in a vicinity) of the target cell 62. It is assumed for the sake of convenience that the wirings 68 and 69 are formed by the same wiring layer or level. Information related to the wirings of the target cell 62 include an intersecting area or overlapping area Su of the wiring 67 on the target cell 62 and the wiring 68 inside the target cell 62, a distance or separation Sd between the wiring

68 inside the target cell 62 and the wiring 69 running on the side of the target cell 62 in parallel to the wiring 68, a width across corners or separation Se of the wiring 69 running on the side of the target cell 62 in parallel to the wiring 68 inside the target cell 62, and the like. FIG. 8 shows a case where only one wiring 68 is provided inside the target cell 62, but when a plurality of wirings are provided inside the target cell 62, the intersecting area Su, the distance Sd, the width across corners Se and the like are obtained for each of the plurality of wirings.

Accordingly, the first layout information or layout parameters, including the cell position information and the cell periphery information of each cell that is used in the layout data of the analyzing target extracted from the cell list, is obtained by carrying out the layout analysis. The first layout information or layout parameters is output with a format which facilitates understanding of the corresponding relationship between each cell and the first layout information, such as a format including a cell name cell1_1, cell position information x1 and y1, a diffusion region separation Sf_1, a gate separation Sf_1, a wiring intersecting area Su_1, a parallel wiring separation Sd_1 and a parallel wiring width across corners Se_1.

Figure 9:
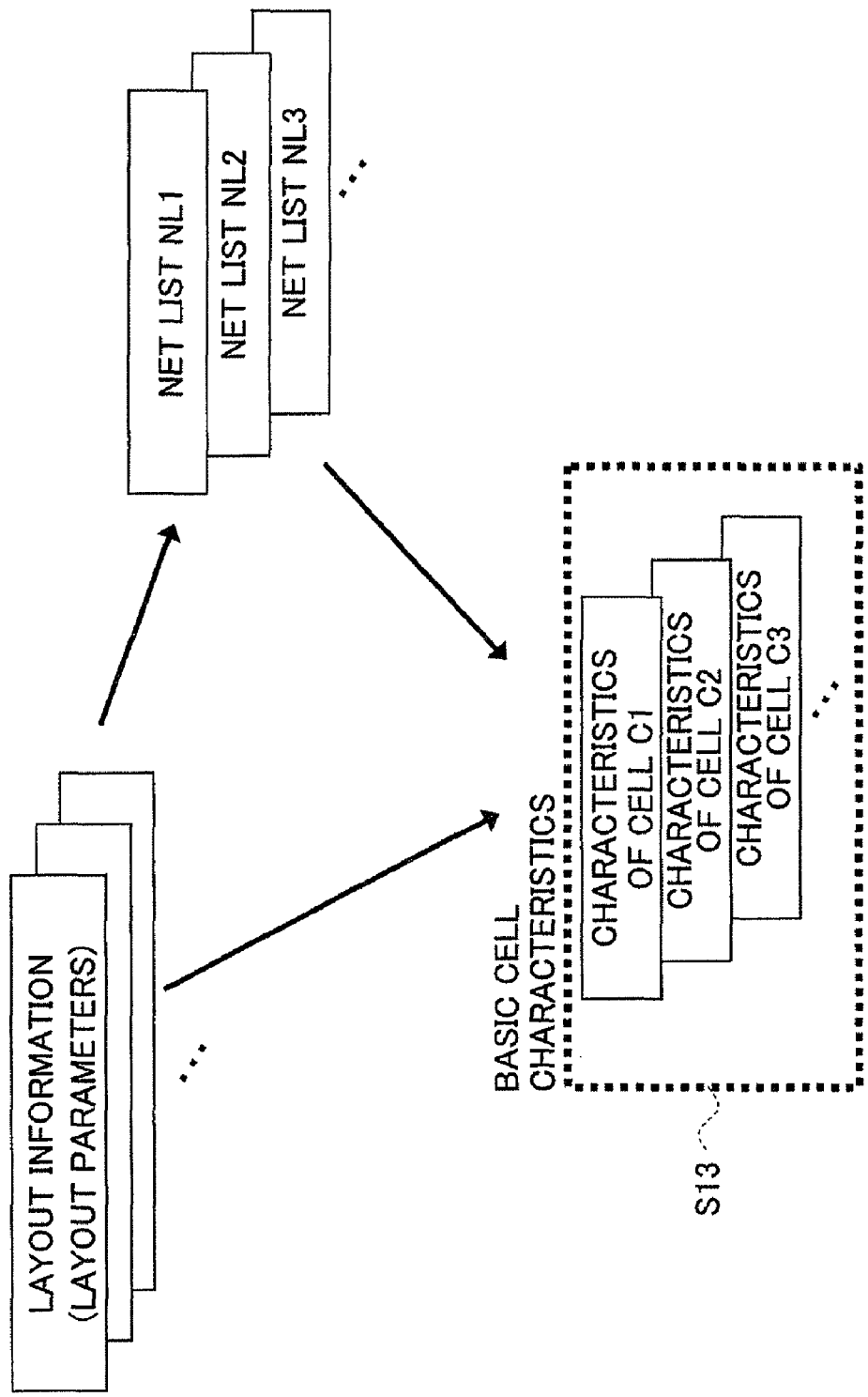
FIG. 9 is a flow chart for explaining, in more detail, extraction of basic cell characteristics using formulas when carrying out the layout analysis of FIG. 5.

FIG. 9 is a flow chart for explaining, in more detail, the extraction of the basic cell characteristics using formulas when carrying out the layout analysis of FIG. 5. In FIG. 9, the step S13 extracts or characterizes the cell characteristics of each of cells C1, C2, ... including at least one of the delay time, the noise characteristic, the leak current, the power consumption and the like from net lists NL1, NL2, ... in accordance with the second layout information or layout parameters, and obtains the basic cell characteristics by substituting the second layout information into the cell characteristics. The net lists NL1, NL2, ... in accordance with the second layout information are net lists that are extracted for every second layout parameter information. The net lists NL1, NL2, ... may be read from the storage part or, input from the input part.

In other words, the step S13 shown in FIG. 9 forms the results of the simulation that are obtained using each of the extracted net lists NL1, NL2, ... into functions or formulas using the second layout information. For example, the following cell characteristics f1, g2, f2 and g2 are obtained for the delay time and the power consumption by forming the net lists into the formulas, where para1, para2, ... denote the second layout information. The other cell characteristics may be formed into formulas in a similar manner.

Delay Time=$f1$(para1, para2, ... )

Delay Inconsistency=$g1$(para1, para2, ... )

Power Consumption=$f2$(para1, para2, ... )

Power Consumption Inconsistency=$g2$(para1, para2, ... )

In this case, the step S14 shown in FIG. 4 obtains the cell characteristics for each layout by substituting the first layout information that is output in the step S12 into the basic cell characteristics represented by the functions or formulas extracted in the step S13.

Figure 10:
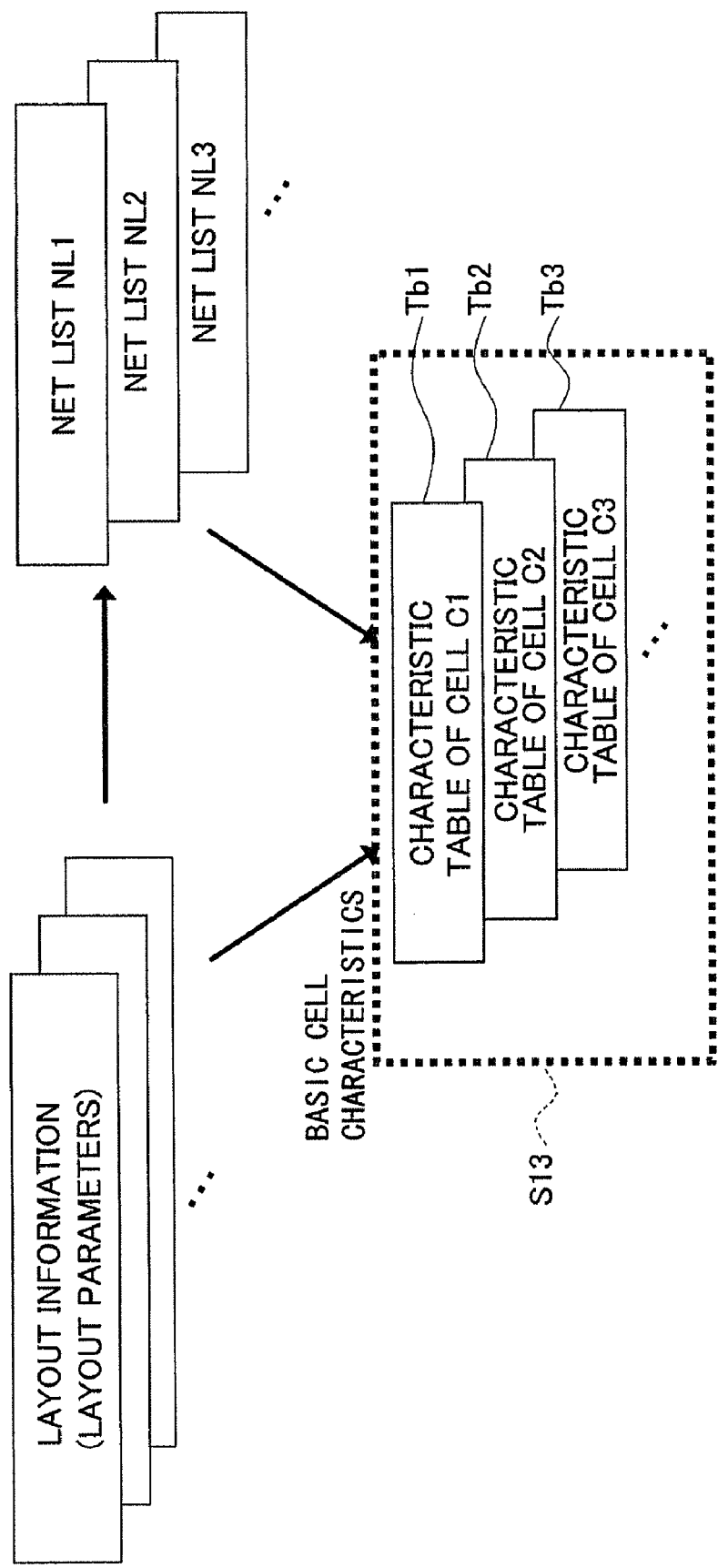
FIG. 10 is a flow chart for explaining, in more detail, extraction of basic cell characteristics using tables when carrying out the layout analysis of FIG. 5.

FIG. 10 is a flow chart for explaining, in more detail, the extraction of basic cell characteristics using tables when carrying out the layout analysis of FIG. 5. In FIG. 10, the step S13 extracts or characterizes the cell characteristics of each of cells C1, C2, ... including at least one of the delay time, the noise characteristic, the leak current, the power consumption and the like from net lists NL1, NL2, ... in accordance with the second layout information or layout parameters, and obtains the basic cell characteristics by substituting the second layout information into the cell characteristics. The net lists NL1, NL2, ... in accordance with the second layout information are net lists that are extracted for every second layout parameter information. The net lists NL1, NL2, ... may be read from the storage part or, input from the input part.

Figure 11:
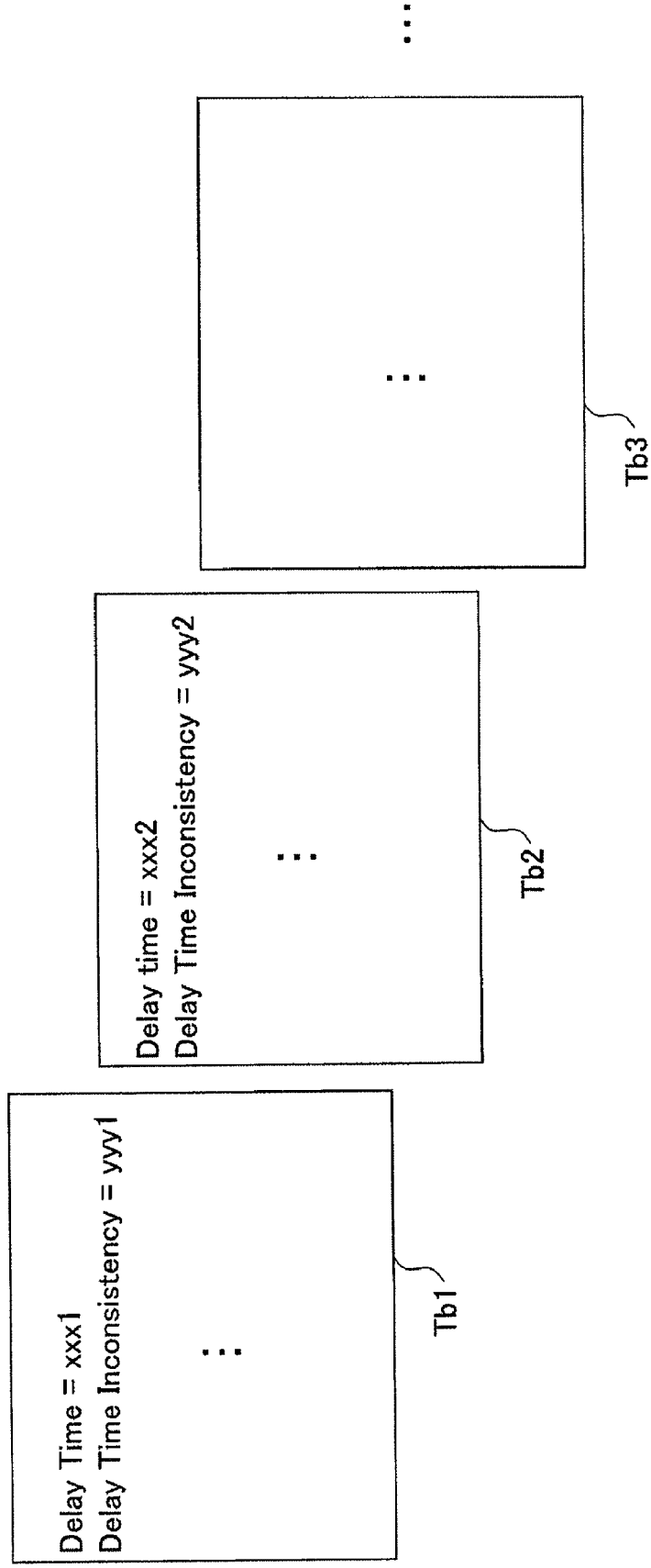
FIG. 11 is a diagram for explaining cell characteristic tables.

In other words, the step S13 shown in FIG. 10 forms the results of the simulation that are obtained using each of the extracted net lists NL1, NL2, ... into characteristic tables Tb1, Tb2, ... of the cells C1, C2, ... shown in FIG. 11, for example, using the second layout information. FIG. 11 is a diagram for explaining the cell characteristic tables Tb1, Tb2, .... In this case, para1, para2, ... denote the second layout information. For example, the cell characteristic table Tb1 includes the cell characteristics related to the cell C1, such as the delay time (=xxx1), the delay time inconsistency (=yyy1) and the like, and the cell characteristic table Tb2 includes the cell characteristics related to the cell C2, such as the delay time (=xxx2), the delay time inconsistency (=yyy2) and the like.

In this case, the step S14 shown in FIG. 4 obtains the cell characteristics for each layout by referring to the cell characteristic table corresponding to the basic cell characteristics extracted in the step S13, and substituting the first layout information that is output in the step S12 into the cell characteristics of the cell characteristic table referred to in the step S13.

Figure 12:
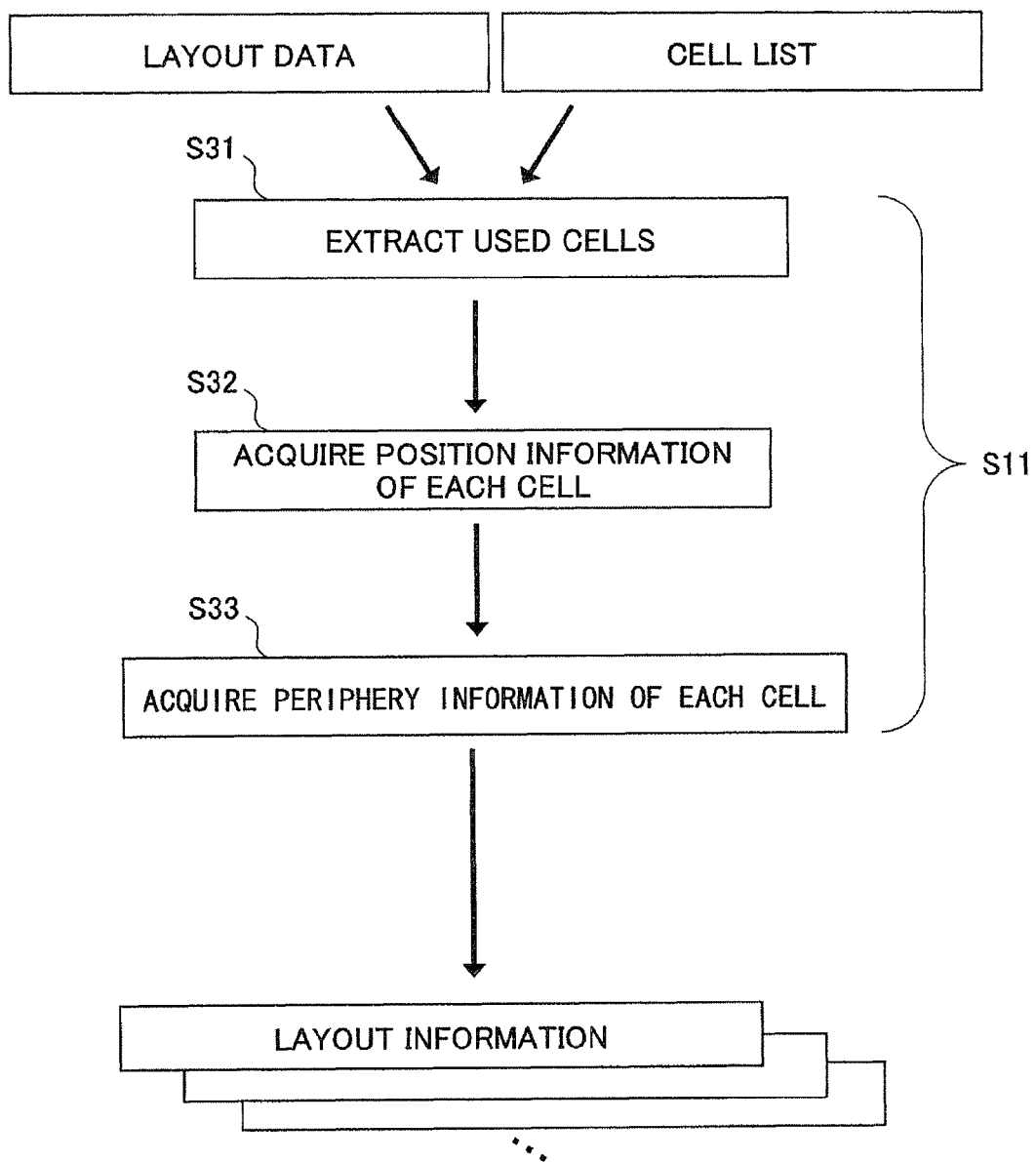
FIG. 12 is a flow chart for explaining, in more detail, a layout analysis excluding the inside of the target cell from the analyzing target.

FIG. 12 is a flow chart for explaining, in more detail, a layout analysis excluding the inside of the target cell from the analyzing target. In FIG. 12, a step S31 extracts the cells which are used in the layout data of the analyzing target from the cell list which is prepared in advance. The layout patterns and the layout positions may differ even for the identical cells, and for this reason, each individual cell is extracted separately. Each of the layout data and the cell list may be read from the storage part or, input from the input part. In addition, the cell list includes at least the cell with respect to which the basic cell characteristics are to be obtained as will be described later.

A step S32 acquires the cell position information of each cell extracted in the step S31, that is, the cell coordinates (x, y) shown in FIG. 6.

Figure 13:
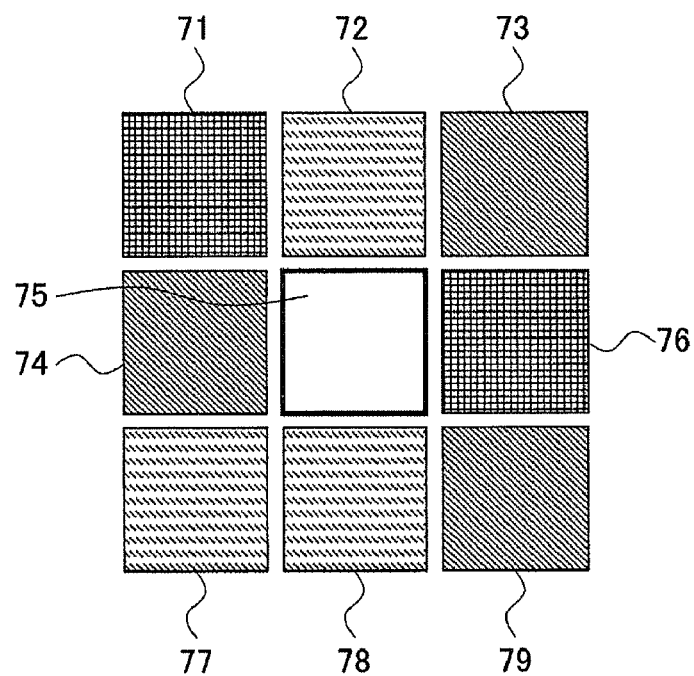
FIG. 13 is a diagram for explaining acquisition of cell periphery information.

A step S33 acquires the cell periphery information related to the type, wiring and the like of each cell extracted in the step S31. FIG. 13 is a diagram for explaining the acquisition of cell periphery information. In FIG. 13, the extracted cells are designated by reference numerals 71 through 79, and it is assumed for the sake of convenience that the target cell is designated by the reference numeral 75. The cells 71 and 76 are of a cell type type1, the cells 72, 77 and 78 are of a cell type type2, and the cells 73, 74 and 79 are of a cell type type3. The cell periphery information related to the cell type of the target cell 75 includes the cell types type1, type2, type3 and the like. Of course, the cell type is not limited to the three kinds.

Figure 14:
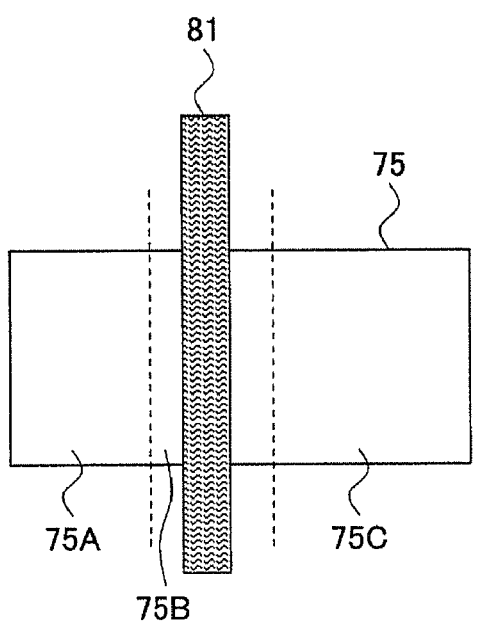
FIG. 14 is a diagram for explaining an upper layer wiring.

FIG. 14 is a diagram for explaining an upper layer or upper level wiring 81 on the target cell 75. FIG. 14 shows the upper layer wiring 81 running over the target cell 75. In this case, no wiring is provided above regions A and C of the target cell 75, but the upper layer wiring 81 is provided above a region B of the target cell 75. The information related to the wiring of the target cell 75 includes a wiring width, an extending direction and the like of the upper layer wiring 81 for each of the regions A through C of the target cell 75.

Therefore, the first layout information or layout parameters, including the cell position information and the cell periphery information of each cell used in the layout data of the analyzing target that is extracted from the cell list, is obtained by carrying out the layout analysis. This first layout information is output with the format which facilitates the understanding of the corresponding relationship between each cell and the first layout information, such as the cell name, the cell position information, the peripheral cell type, the information of the upper layer wiring on the cell and the like.

Figure 15:
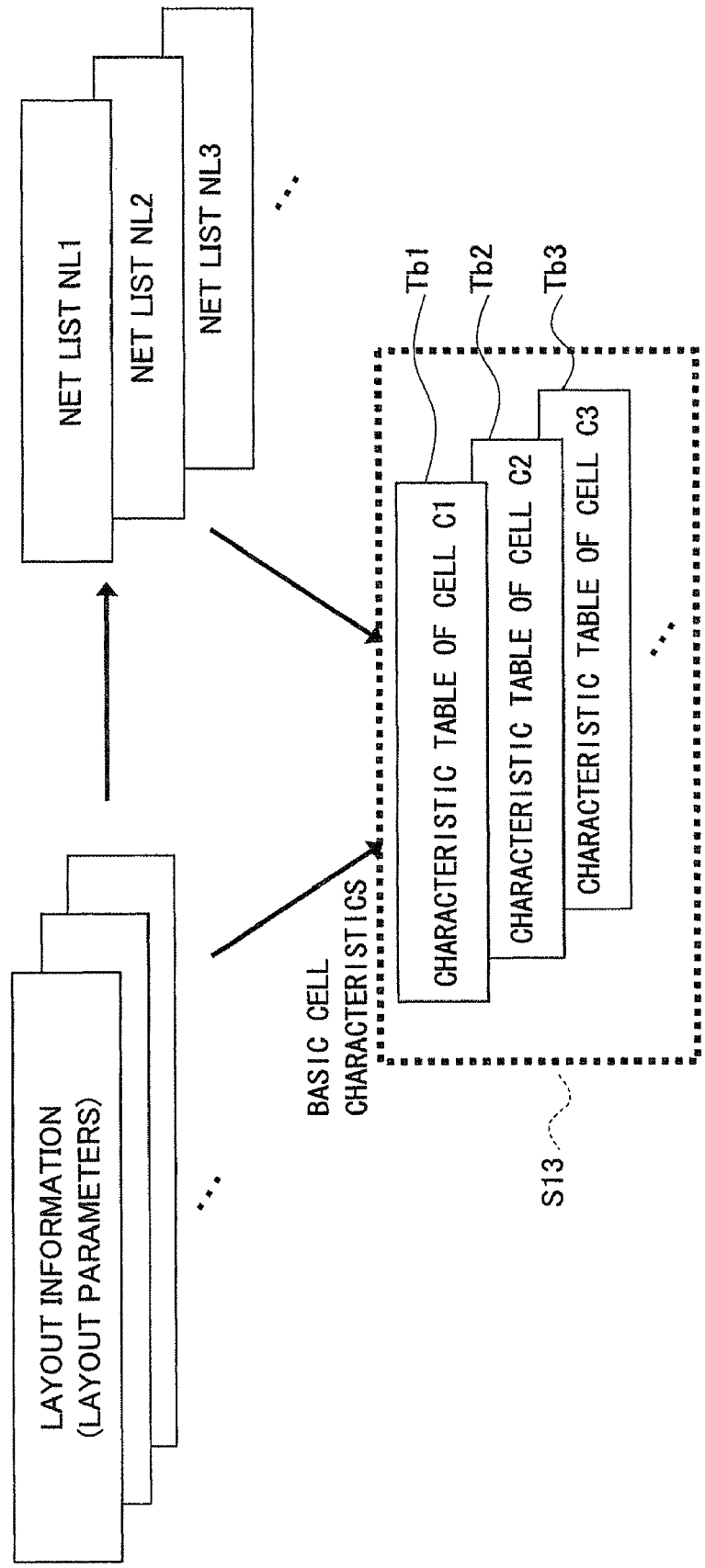
FIG. 15 is a flow chart for explaining, in more detail, extraction of basic cell characteristics when carrying out the layout analysis of FIG. 12.

FIG. 15 is a flow chart for explaining, in more detail, the extraction of basic cell characteristics when carrying out the layout analysis of FIG. 12. FIG. 15 shows the extraction of the basic cell characteristics using the tables. In FIG. 15, the step S13 extracts (or characterizes) the cell characteristics of each of cells C1, C2, . . . including at least one of the delay time, the noise characteristic, the leak current, the power consumption and the like from net lists NL1, NL2, . . . in accordance with the second layout information or layout parameters, and obtains the basic cell characteristics by substituting the second layout information into the cell characteristics. The net lists NL1, NL2, . . . in accordance with the second layout information are net lists that are extracted for every second layout parameter information. The net lists NL1, NL2, . . . may be read from the storage part or, input from the input part.

In other words, the step S13 shown in FIG. 15 forms the results of the simulation that are obtained using each of the extracted net lists NL1, NL2, . . . into the characteristic tables Tb1, Tb2, . . . of the cells C1, C2, . . . shown in FIG. 11, for example, using the second layout information.

In this case, the step S14 shown in FIG. 4 obtains the cell characteristics for each layout by referring to the cell characteristic table corresponding to the basic cell characteristics extracted in the step S13, and substituting the first layout information that is output in the step S12 into the cell characteristics of the cell characteristic table referred to in the step S13.

According to this embodiment, the cell characteristics in accordance with the layout are represented by substituting the first layout information that is acquired by the layout analysis into the basic cell characteristics. For this reason, when modifying the layout, it is possible to appropriately modify the cell characteristics by substituting the first layout information that is acquired by the layout analysis with respect to the modified layout that is, the layout after the modification into the basic cell characteristics. There is no need to modify the net list. In addition, it is unnecessary to extract the cell characteristics from the net list every time the layout is modified or, for every layout. Consequently, it is possible to input or incorporate the deviation in the circuit characteristics due to the layout and improve the prediction accuracy of the circuit characteristics, and at the same time, efficiently carry out the analysis in the chip level.

This application claims the benefit of a Japanese patent application No. 2007-202076 filed Aug. 2, 2007, in the Japanese Patent Office, the disclosure of which is hereby incorporated by reference.

Further, the present invention is not limited to these embodiments, but various variations and modifications may be made without departing from the scope of the present invention.

What is claimed is:

1. A simulation method, to be implemented in a computer, for carrying out a simulation of a semiconductor integrated circuit by the computer, said simulation method comprising:
a first analyzing procedure, executed by the computer, carrying out a layout analysis based on layout data of a circuit formed by cells, and storing values of first layout parameters that are obtained by the layout analysis and represent a first layout into a storage part;
an extracting procedure, executed by the computer, extracting basic cell characteristics of the cells from a net list, representing the extracted basic cell characteristics by second layout parameters that represent a second layout different from the first layout, and storing the basic cell characteristics represented by the second layout parameters into the storage part, said basic cell characteristics including at least one of a noise characteristic and a leak current;
an acquiring procedure, executed by the computer, reading the values of the first layout parameters from the storage part, substituting the read values into the basic cell characteristics represented by the second layout parameters to obtain cell characteristics, and storing the cell characteristics in the storage part; and
a second analyzing procedure, executed by the computer, analyzing an operation of the circuit using the cell characteristics obtained by the acquiring procedure,
wherein the second layout parameters represent the second layout which is used to form the basic cell characteristics into a function by varying values of the second layout parameters within a range tolerable by the layout analysis with respect to the first layout to which first analyzing procedure carries out the layout analysis.

2. The simulation method as claimed in claim 1, wherein the first analyzing procedure extracts the cells from a cell list including said cells, and acquires cell position information and cell periphery information of the extracted cells.

3. The simulation method as claimed in claim 2, wherein the extracting procedure extracts the cell characteristics of the cells from a net list in accordance with the second layout parameters, and carries out a simulation using said net list from which the cell characteristics are extracted to form the basic cell characteristics into functions using the second layout parameters.

4. The simulation method as claimed in claim 3, wherein the acquiring procedure obtains the cell characteristics by substituting said values into the functions formed from the basic cell characteristics.

5. The simulation method as claimed in claim 2, wherein the extracting procedure extracts the cell characteristics of the cells from a net list in accordance with the second layout parameters, and carries out a simulation using said net list from which the cell characteristics are extracted to form the basic cell characteristics into tables with respect to the second layout parameters.

6. The simulation method as claimed in claim 5, wherein the acquiring procedure obtains the cell characteristics corresponding to said values by referring to the tables.

7. The simulation method as claimed in claim 1, wherein the first analyzing procedure extracts cells used in layout data of an analyzing target, and acquires cell position information and cell periphery information of the extracted cells.

8. The simulation method as claimed in claim 7, wherein the extracting procedure extracts the cell characteristics of the cells from a net list in accordance with the second layout parameters, and forms tables corresponding to the second layout parameters by carrying out a simulation using the net list from which the cell characteristics are extracted.

9. The simulation method as claimed in claim 8, wherein the acquiring procedure obtains the cell characteristics corresponding to said values by referring to the tables.

10. The simulation method as claimed in claim 1, wherein the basic cell characteristics further include at least one of a delay time and a power consumption.

11. A non-transitory computer-readable storage medium that stores a program which, when executed by a computer, causes the computer to perform a simulation process related to a semiconductor integrated circuit, said simulation process comprising:
a first analyzing procedure causing the computer to carry out a layout analysis based on layout data of a circuit formed by cells, and to store values of first layout parameters that are obtained by the layout analysis and represent a first layout into a storage part;
an extracting procedure causing the computer to extract basic cell characteristics of the cells from a net list, to represent the extracted basic cell characteristics by second layout parameters that represent a second layout different from the first layout, and to store the basic cell characteristics represented by the second layout parameters into the storage part, said basic cell characteristics including at least one of a noise characteristic and a leak current;
an acquiring procedure causing the computer to read the values of the first layout parameters from the storage part, to substitute the read values into the basic cell characteristics represented by the second layout parameters to obtain cell characteristics, and to store the cell characteristics in the storage part; and
a second analyzing procedure causing the computer to analyze an operation of the circuit using the cell characteristics obtained by the acquiring procedure,
wherein the second layout parameters represent the second layout which is used to form the basic cell characteristics into a function by varying values of the second layout parameters within a range tolerable by the layout analysis with respect to the first layout to which first analyzing procedure carries out the layout analysis.

12. The non-transitory computer-readable storage medium as claimed in claim 11, wherein the first analyzing procedure causes the computer to extract the cells from a cell list which includes said cells, and to acquire cell position information and cell periphery information of the extracted cells.

13. The non-transitory computer-readable storage medium as claimed in claim 12, wherein the extracting procedure causes the computer to extract the cell characteristics of the cells from a net list in accordance with the second layout parameters, and to carry out a simulation using said net list from which the cell characteristics are extracted to form the basic cell characteristics into functions using the second layout parameters.

14. The non-transitory computer-readable storage medium as claimed in claim 13, wherein the acquiring procedure causes the computer to obtain the cell characteristics by substituting said values into the functions formed from the basic cell characteristics.

15. The non-transitory computer-readable storage medium as claimed in claim 12, wherein the extracting procedure causes the computer to extract the cell characteristics of the cells from a net list in accordance with the second layout parameters, and to carry out a simulation using said net list from which the cell characteristics are extracted to form the basic cell characteristics into tables with respect to the second layout parameters.

16. The non-transitory computer-readable storage medium as claimed in claim 15, wherein the acquiring procedure causes the computer to obtain the cell characteristics corresponding to said values by referring to the tables.

17. The non-transitory computer-readable storage medium as claimed in claim 11, wherein the first analyzing procedure causes the computer to extract cells used in layout data of an analyzing target, and to acquire cell position information and cell periphery information of the extracted cells.

18. The non-transitory computer-readable storage medium as claimed in claim 17, wherein the extracting procedure causes the computer to extract the cell characteristics of the cells from a net list in accordance with the second layout parameters, and to form tables corresponding to the second layout parameters by carrying out a simulation using the net list from which the cell characteristics are extracted.

19. The non-transitory computer-readable storage medium as claimed in claim 18, wherein the acquiring procedure causes the computer to obtain the cell characteristics corresponding to said values by referring to the tables.

20. The non-transitory computer-readable storage medium as claimed in claim 11, wherein the basic cell characteristics further include at least one of a delay time and a power consumption.

* * * * *